(12) United States Patent
Murali et al.

(10) Patent No.: US 8,101,451 B1
(45) Date of Patent: Jan. 24, 2012

(54) METHOD TO FORM A DEVICE INCLUDING AN ANNEALED LAMINA AND HAVING AMORPHOUS SILICON ON OPPOSING FACES

(75) Inventors: Venkatesan Murali, San Jose, CA (US); Christopher J Petti, Mountain View, CA (US); Theodore Smick, Essex, MA (US); Mohamed M Hilali, Austin, TX (US); Kathy J Jackson, Felton, CA (US); Zhiyong Li, Los Altos, CA (US); Gopalakrishna Prabhu, San Jose, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 12/980,427

(22) Filed: Dec. 29, 2010

(51) Int. Cl.
    *H01L 21/00* (2006.01)
    *H01L 31/00* (2006.01)
(52) U.S. Cl. ............... 438/57; 438/73; 136/256
(58) Field of Classification Search ............ 438/57, 438/73; 136/256
    See application file for complete search history.

(56) References Cited

U.S. PATENT DOCUMENTS

| | | | |
|---|---|---|---|
| 4,219,368 A * | 8/1980 | David | 136/249 |
| 5,589,008 A | 12/1996 | Keppner | |
| 7,605,053 B2 * | 10/2009 | Couillard et al. | 438/455 |
| 7,732,301 B1 | 6/2010 | Pinnington et al. | |
| 7,749,884 B2 | 7/2010 | Mathew et al. | |
| 7,981,778 B2 * | 7/2011 | Rana et al. | 438/486 |
| 2008/0160661 A1 | 7/2008 | Henley | |
| 2008/0179547 A1 | 7/2008 | Henley | |
| 2009/0277314 A1 | 11/2009 | Henley | |
| 2010/0178723 A1 | 7/2010 | Henley | |
| 2010/0326510 A1 | 12/2010 | Agarwal et al. | |

OTHER PUBLICATIONS

U.S. Appl. No. 12/826,762, filed Jun. 30, 2010, titled "A Formed Ceramic Receiver Element Adhered to a Semiconductor Lamina", Agarwal et al.
Ravi, K.V., "Thin Single Crystal Silicon Solar Cells on Ceramic Substrates," PowerPoint presentation, U.S Department of Energy, Solar Energy Technologies Program Peer Review, May 25, 2010.
Solanki, C. S. et al., "Thin-film Free-standing Monocrystalline Si Solar Cells with Heterojunction Emitter," Prog. Photovolt: Res. Appl. 2005; 13:201-208.

* cited by examiner

*Primary Examiner* — William D Coleman
(74) *Attorney, Agent, or Firm* — The Mueller Law Office, P.C.

(57) ABSTRACT

A semiconductor assembly is described in which a support element is constructed on a surface of a semiconductor lamina. Following formation of the thin lamina, which may have a thickness about 50 microns or less, the support element is formed, for example by plating, or by application of a precursor and curing in situ, resulting in a support element which may be, for example, metal, ceramic, polymer, etc. This is in contrast to a rigid or semi-rigid pre-formed support element which is affixed to the lamina following its formation, or to a donor wafer from which the lamina is subsequently cleaved. Fabricating the support element in situ may avoid the use of adhesives to attach the lamina to a permanent support element; such adhesives may be unable to tolerate processing temperatures and conditions required to complete the device. In some embodiments, this process flow allows the lamina to be annealed at high temperature, then to have an amorphous silicon layer formed on each face of the lamina following that anneal. A device may be formed which comprises the lamina, such as a photovoltaic cell.

14 Claims, 14 Drawing Sheets

Embodiment of 12/026530

Embodiment of 12/026530

Embodiment of 12/026530

Embodiment of 12/026530

METHOD TO FORM A DEVICE INCLUDING AN ANNEALED LAMINA AND HAVING AMORPHOUS SILICON ON OPPOSING FACES

RELATED APPLICATIONS

This application is related to Murali et al., U.S. patent application Ser. No. 12/980,424, "A Method to Form a Device by Constructing a Support Element on a Thin Semiconductor Lamina," filed on even date herewith, owned by the assignee of the present application, and hereby incorporated by reference.

BACKGROUND OF THE INVENTION

The invention relates to a method to construct a support element on a thin semiconductor lamina.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n− junction (as shown in FIG. 1) or a n+/p− junction. The more lightly doped region is known as the base of the photovoltaic cell, while the more heavily doped region, of opposite conductivity type, is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

If the photovoltaic cell is made very thin, it may require structural support.

SUMMARY OF THE INVENTION

The present invention is defined by the following claims, and nothing in this section should be taken as a limitation on those claims. In general, the invention is directed to a method to form a permanent support element on a surface of a thin lamina following cleaving of the lamina from a donor body.

A first aspect of the invention provides for a method to fabricate a device, the method comprising providing a monocrystalline semiconductor lamina having a thickness about 50 microns or less, the lamina having a first surface and a second surface opposite the first; annealing the semiconductor lamina to a temperature of 850 degrees C. or greater; and fabricating a photovoltaic cell, wherein the completed cell has a first amorphous silicon layer in immediate contact with the first surface, and a second amorphous silicon layer in immediate contact with the second surface.

Each of the aspects and embodiments of the invention described herein can be used alone or in combination with one another.

The preferred aspects and embodiments will now be described with reference to the attached drawings.

DETAILED DESCRIPTION OF THE EMBODIMENTS

Figure 1:
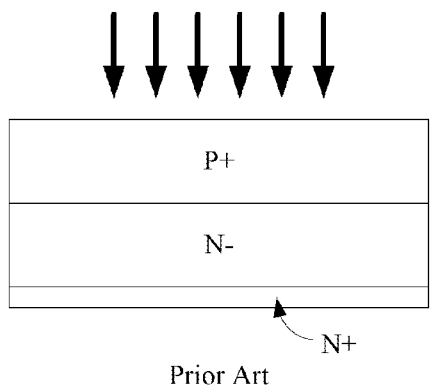
FIG. 1 is a cross-sectional view of a prior art photovoltaic cell.
Figure 2A:
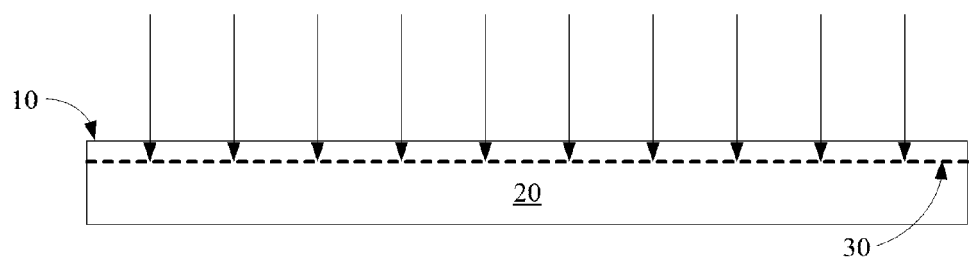
FIGS. 2a-2d are cross-sectional views showing stages in formation of the photovoltaic device of Sivaram et al., U.S. patent application Ser. No. 12/026,530.
Figure 2B:
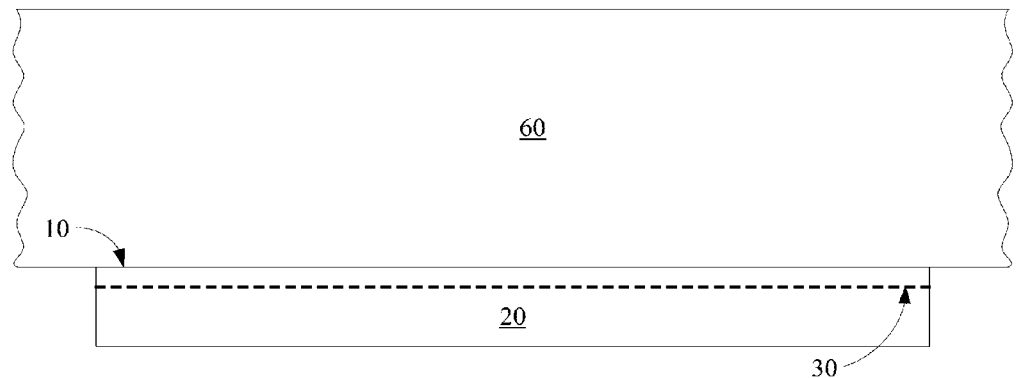
Figure 2C:
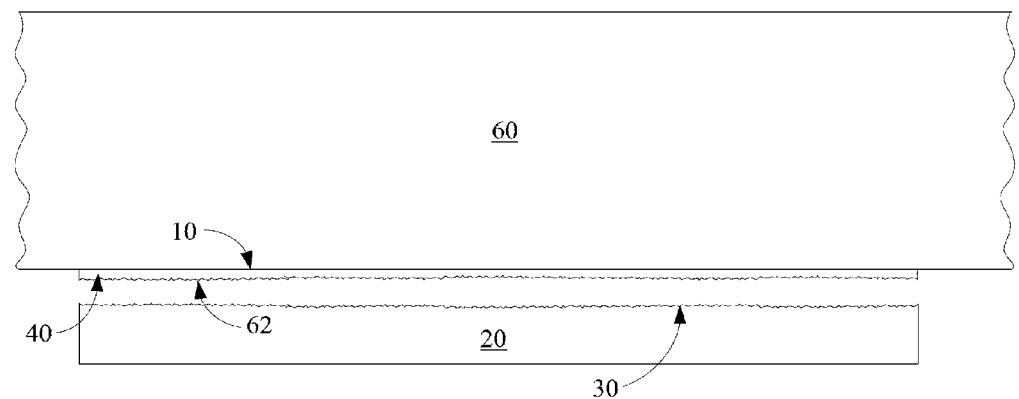
Figure 2D:
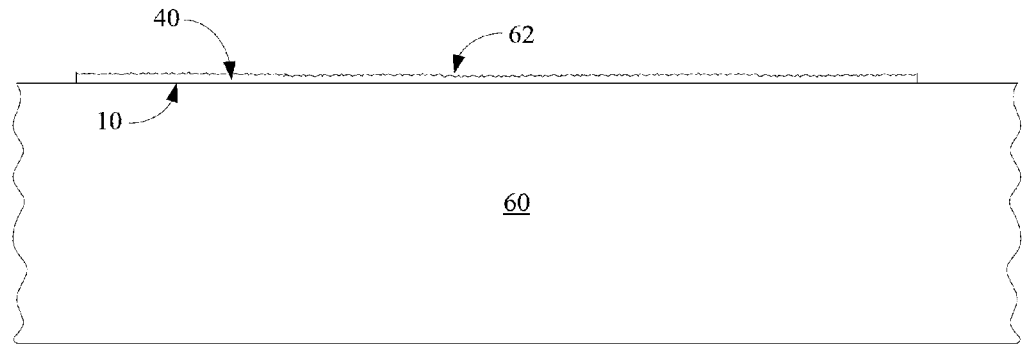

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick or between about 4 and about 20 or between about 5 and about 15 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

Using the methods of Sivaram et al., photovoltaic cells, rather than being formed from sliced wafers, are formed of thin semiconductor laminae without wasting silicon through kerf loss or by fabrication of an unnecessarily thick cell, thus reducing cost. The same donor wafer can be reused to form multiple laminae, further reducing cost, and may be resold after exfoliation of multiple laminae for some other use.

Cleaving is most easily achieved by heating, for example to temperatures of 500 degrees C. or more. It has been found that the step of implanting to define the cleave plane may cause damage to the crystalline lattice of the monocrystalline donor wafer. This damage, if unrepaired, may impair cell efficiency. A relatively high-temperature anneal, for example at 900 degrees C., 950 degrees C., or more, will repair most implant damage in the body of the lamina.

Figure 3A:
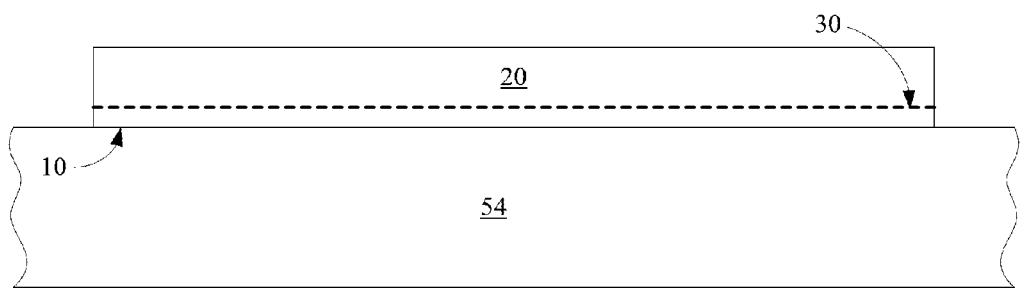
FIGS. 3a-3d are cross-sectional views showing stage in formation of a photovoltaic device according to embodiments of the present invention.
Figure 3B:
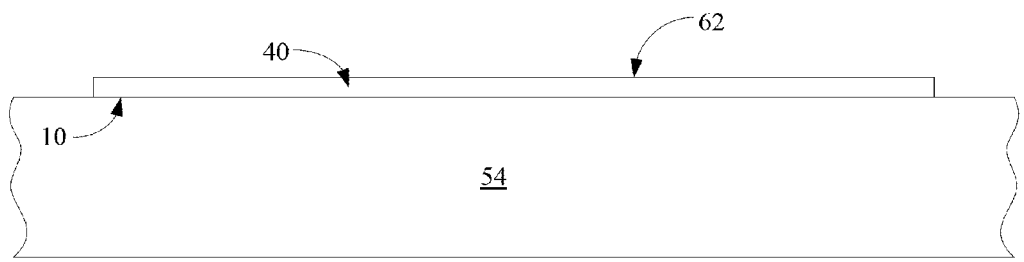

Turning to FIG. 3a, in the present invention, a donor wafer 20 is implanted through first surface 10 to form cleave plane 30. First surface 10 may be placed adjacent vacuum chuck 54. As shown in FIG. 3b, a heating step is performed and lamina 40 separates from the donor wafer at the cleave plane, creating second surface 62. Referring to FIGS. 3a and 3b, note that during the cleaving step, first surface 10 of the donor wafer is not permanently affixed to a support element.

Figure 3C:
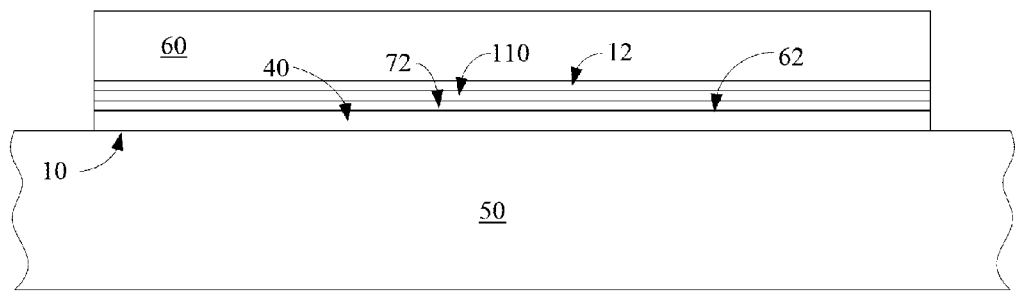

An anneal, for example at 900 degrees C. or higher, is performed to repair damage caused to the crystal lattice of lamina 40 during the implant step that formed cleave plane 30 of FIG. 3a. Following this anneal, lamina 40 may be transferred from the vacuum chuck and affixed to a temporary support element 50, as shown in FIG. 3c. As will be described in additional detail, one or more layers, including, for example, amorphous silicon layer 72, transparent conductive oxide (TCO) layer 110, and reflective metal layer 12, are deposited on lamina 40. A permanent support element 60 is constructed on lamina 40; in the embodiment shown, it is constructed directly on metal layer 12, which is formed over second surface 62 of lamina 40. A support element is considered to be "constructed" if it is formed in situ, rather than being provided as a pre-formed element. Examples include: a metal support element formed by plating, for example by electroplating or electroless plating; a ceramic support element formed by applying a ceramic mixture followed by curing in place; or a polymer support element formed by applying a the polymer in liquid or semi-liquid form and curing in place. Additional layers may be formed on or over amorphous silicon layer 72 before construction of support element 60. Support element 60 will be made sufficiently thick to provide mechanical support to lamina 40, which is too thin and fragile to survive much handling without such support.

Figure 3D:
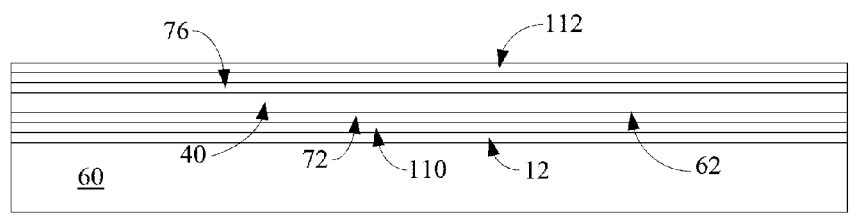

Turning to FIG. 3d, following construction of support element 60, lamina 40 is detached from temporary support element 50. FIG. 3d shows the structure inverted, with constructed support element 60 on the bottom, as in most embodiments. Additional layers, such as amorphous silicon layer 76 and ITO layer 112 are deposited, forming a photovoltaic cell.

Figure 4:
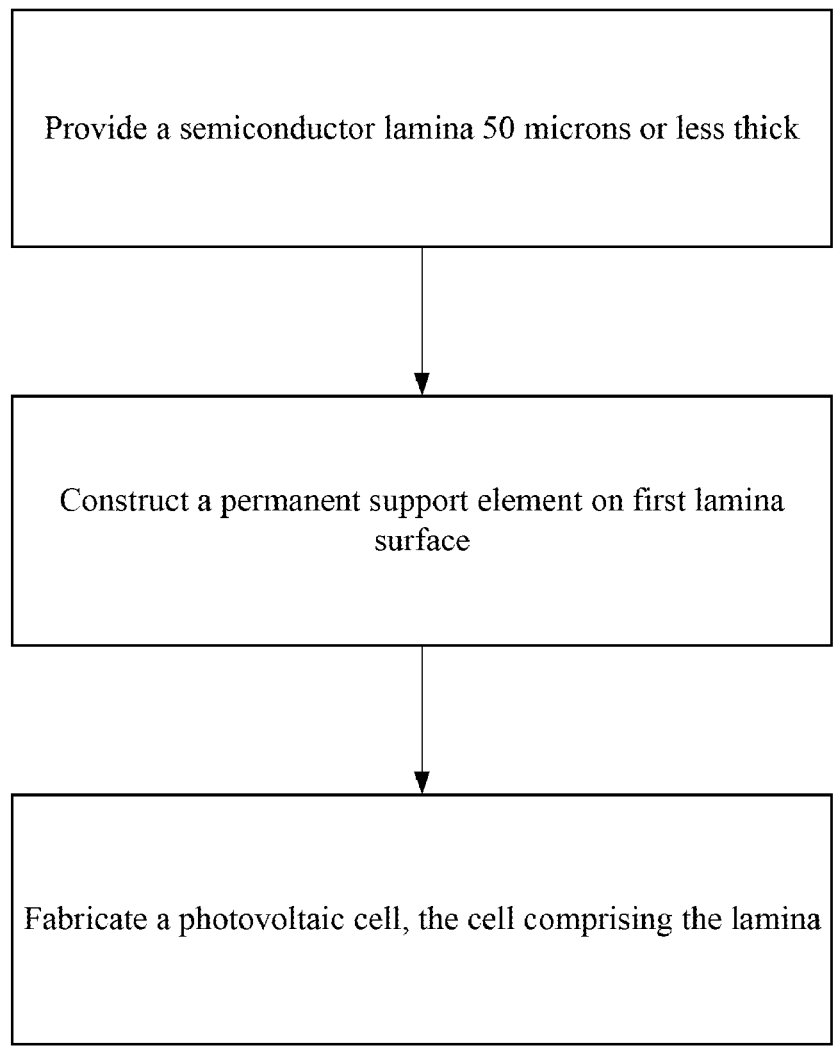
FIG. 4 is a flow chart showing steps of a method according to aspects of the present invention.

In the present invention, then, a device is formed by a method comprising providing a semiconductor lamina having a thickness about 50 microns or less, the lamina having a first surface and a second surface opposite the first; constructing a permanent support element on the first surface of the lamina; and fabricating a photovoltaic cell, wherein the photovoltaic cell comprises the lamina. The thickness may be between about 4 microns and about 20 microns. One, two or more layers may be formed on the first surface of the lamina before the step of constructing a permanent support element. This method is illustrated in FIG. 4.

In aspects of the invention, a device is formed by implanting a semiconductor donor body with ions to define a cleave plane; cleaving a semiconductor lamina from the donor body at the cleave plane, wherein the lamina has a first surface and a second surface opposite the first; after the cleaving step, constructing a permanent support element on the first surface of the lamina; and fabricating a photovoltaic cell, wherein the lamina comprises a base region of the photovoltaic cell.

While different flows are possible, in general, the thin lamina is provided. In most embodiments, it has been cleaved from a larger body, such as a wafer or boule. After one surface of the lamina has been affixed to a temporary support, the permanent support element is constructed on the opposite face. Then the affixed face is detached from the temporary support element.

Constructing support element 60 following the steps of cleaving and damage anneal, as in the present invention, provides several significant advantages. The steps of cleaving and damage anneal take place at relatively high temperature. If a pre-formed support element is affixed to the donor wafer before these high-temperature steps, it will necessarily be exposed to high temperature along with the lamina, as will any intervening layers. Many materials cannot readily tolerate high temperature, and if the coefficients of thermal expansion (CTEs) of the support element and the lamina are mismatched, heating and cooling will cause strain which may damage the thin lamina.

Further, note that the cell of FIG. 3d includes heavily doped amorphous silicon layers, 72 and 76, on both surfaces of lamina 40. Lamina 40 is more lightly doped than the amorphous silicon layers, 72 and 76, and will serve as the base region of the photovoltaic cell. The base region of the cell absorbs incident light, and is where most charge carriers are generated. Lamina 40 is very thin, much thinner than the absorber region of a conventional photovoltaic cell. Thus, passivation of surfaces 10 and 62 of the lamina is particularly important to avoid loss of charge carriers by recombination. Amorphous silicon layers 72 and 76 are effective means of passivation, and their use is advantageous with a very thin absorber.

Amorphous silicon, however, cannot be exposed to the high temperature required to perform cleaving and damage anneal; such temperature will cause the amorphous silicon to crystallize. By cleaving and performing a damage anneal, both high temperature steps, before the lamina is permanently affixed to any support element, both surfaces of lamina 40 remain accessible for subsequent deposition of layers that cannot tolerate high temperature. Such layers include amorphous silicon layers, and also, for example, aluminum or silver, which will tend to diffuse into silicon at high temperature, altering the electrical behavior of the cell.

Figure 5:
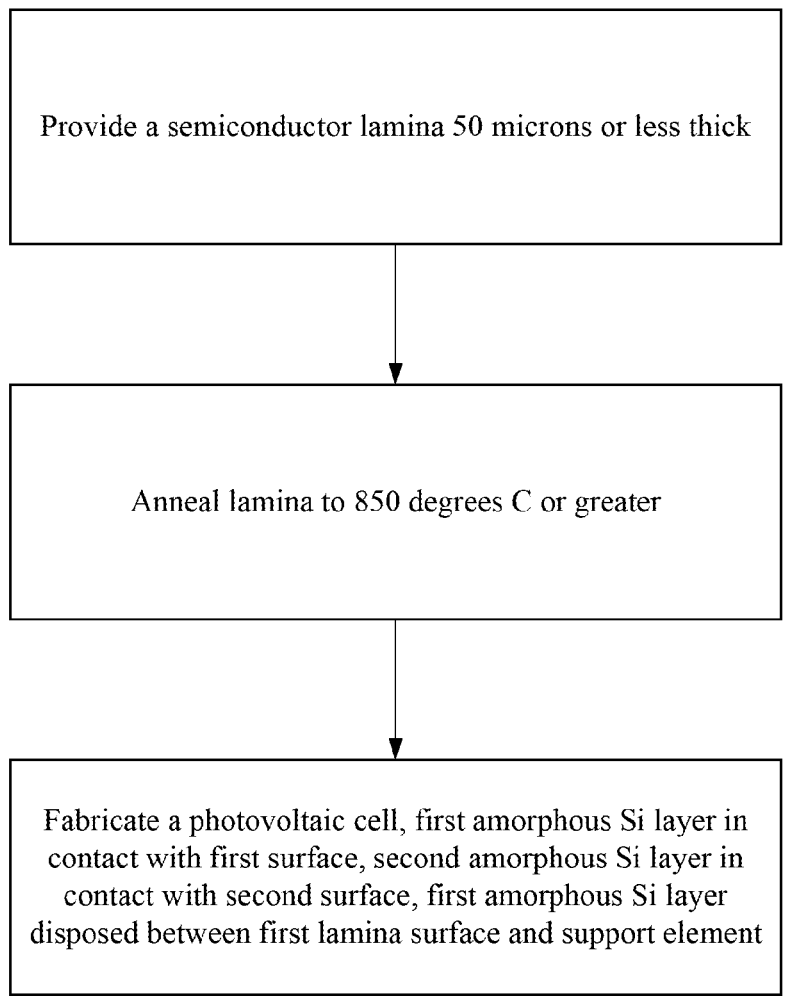
FIG. 5 is a flow chart showing steps of a method according to aspects of the present invention.

Thus, a method is taught to fabricate a device, the method comprising: providing a semiconductor lamina having a thickness about 50 microns or less, the lamina having a first surface and a second surface opposite the first; annealing the semiconductor lamina to a temperature of 850 degrees C. or greater; and fabricating a photovoltaic cell, wherein the completed cell has a first amorphous silicon layer in immediate contact with the first surface, and a second amorphous silicon layer in immediate contact with the second surface. The steps of this method are summarized in FIG. 5.

Either the first or the second amorphous silicon layer comprises an emitter of the photovoltaic cell. At least a portion of the first amorphous silicon layer is heavily doped to a first conductivity type, while at least a portion of the second amorphous silicon layer is heavily doped to a second conductivity type opposite the first. Following the annealing step, in some embodiments a permanent support element is constructed on or over the first surface of the lamina, wherein, in the completed cell, the first amorphous silicon layer is disposed between the first surface of the lamina and the support element.

Constructing a support element on a surface of the lamina also avoids the use of adhesives, which would be required to adhere the lamina to a preformed support element. Adhesives exposed to even relatively low temperatures will outgas volatiles during a curing process; such volatiles would be trapped between the support element and the lamina, resulting in imperfect and nonuniform adhesion.

For clarity, detailed examples of a photovoltaic assembly including a lamina having thickness between 0.2 and 100 microns, in which a support element is constructed on the lamina following its cleaving from the donor, will be provided. For completeness, many materials, conditions, and steps will be described. It will be understood, however, that many of these details can be modified, augmented, or omitted while the results fall within the scope of the invention.

EXAMPLE

Support Element Formed by Plating

The process begins with a donor body of an appropriate semiconductor material. An appropriate donor body may be a monocrystalline silicon wafer of any practical thickness, for example from about 200 to about 1000 microns thick or more. Typically the wafer has a <100> orientation, though wafers of other orientations may be used. Different crystalline orientations may be selected, for example, to avoid channeling during the implant step to come. In alternative embodiments, the donor wafer may be thicker; maximum thickness is limited only by practicalities of wafer handling, and may be, for example, 10,000 microns or more. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal, or pseudosquare, cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 6A:
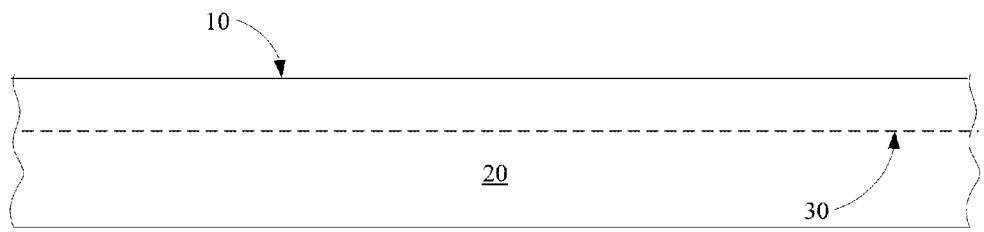
FIGS. 6a-6e are cross-sectional views showing stage in formation of a photovoltaic device having a constructed metal support element according to embodiments of the present invention.

Referring to FIG. 6a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1\times10^{15}$ and about $1\times10^{18}$ dopant atoms/cm$^3$, for example about $1\times10^{17}$ dopant atoms/cm$^3$. Donor wafer 20 may be, for example, solar- or semiconductor-grade silicon.

In the next step, ions, preferably hydrogen or a combination of hydrogen and helium, are implanted into wafer 20 through first surface 10 to define cleave plane 30, as described earlier. This implant may be performed using the teachings of Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009; or of Purser et al. U.S. patent application Ser. No. 12/621,689, "Method and Apparatus for Modifying a Ribbon-Shaped Ion Beam," filed Nov. 19, 2009, all owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns, between about 1 or 2 microns and about 5 or 6 microns, or between about 4 and about 8 microns. Alternatively, the depth of cleave plane 30 can be between about 5 and about 15 microns, for example about 11 or 12 microns.

Texture (not shown) may be formed at first surface 10 to minimize reflection. A method for forming advantageous low-relief texture is disclosed in Li et al., U.S. patent application Ser. No. 12/729,878, "Creation of Low-Relief Texture for a Photovoltaic Cell," filed Mar. 23, 2010, owned by the assignee of the present invention and hereby incorporated by reference. The method of Li et al. includes buffing the surface, which may induce stress, tending to provide nucleation points for a crystallographically selective etch.

Figure 6B:
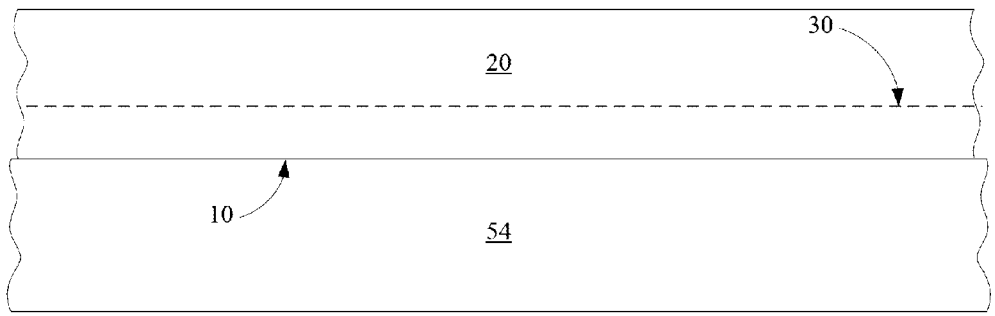

Turning to FIG. 6b, following the texture etch, first surface 10 may be placed adjacent to vacuum chuck 54, and a vacuum applied to hold donor wafer 20 in place. Vacuum chuck 54 and donor wafer 20 may be enclosed, for example in a quartz envelope.

Figure 6C:
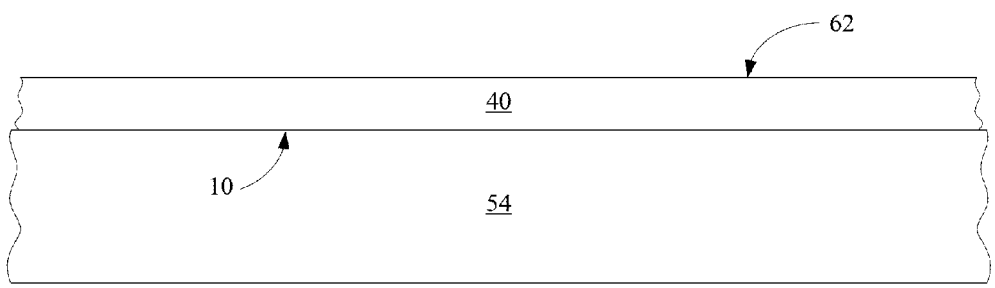

Referring to FIG. 6c, a thermal step causes monocrystalline silicon lamina 40 to cleave from the donor wafer at the cleave plane. Cleaving is achieved in this example by exfoliation, which may be achieved at temperatures between, for example, about 350 and about 650 degrees C., for example, about 550 degrees C. In general, exfoliation proceeds more rapidly at higher temperature. During cleaving, pressure may be applied by using a plate attached to a piston that will press donor wafer 20 to vacuum chuck 54. Pressures in the range of about 1 to about 100 psi, for example 40 psi, could be applied. The thickness of lamina 40 is determined by the depth of cleave plane 30. In many embodiments, the thickness of lamina 40 is between about 1 and about 10 microns, for example between about 2 and about 5 microns, for example about 4.5 microns. In other embodiments, the thickness of lamina 40 is between about 4 and about 20 microns, for example between about 10 and about 15 microns, for example about 11 microns. Second surface 62 is created by cleaving.

An anneal step may be performed to repair damage caused to the crystal lattice throughout the body of lamina 40 during the implant step Annealing may be performed while lamina 40 remains in place on vacuum chuck 54, for example, at 500 degrees C. or greater, for example at 550, 600, 650, 700, 800, 850 degrees C. or greater, at about 950 degrees C. or more. The structure may be annealed, for example, at about 650 degrees C. for about 45 minutes, or at about 800 degrees for about ten minutes, or at about 950 degrees for 120 seconds or less. In many embodiments the temperature exceeds 900 degrees C. for at least 60 seconds.

Figure 6D:
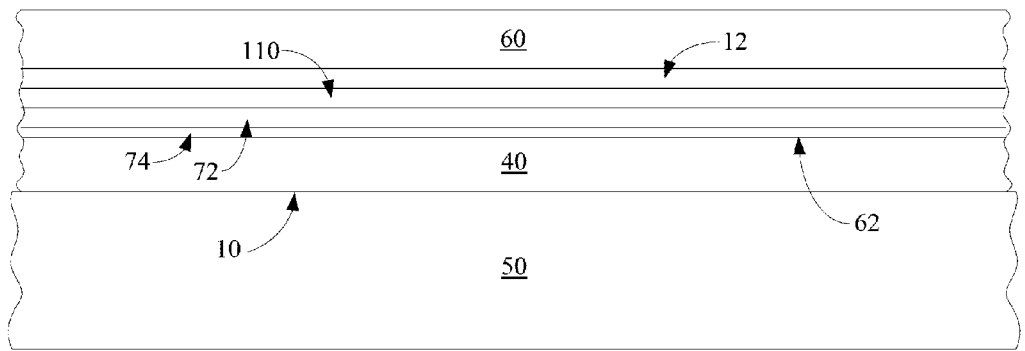

Next lamina 40 is removed from vacuum chuck 54. This may be done, for example, using a vacuum paddle, not shown. To affect this transfer, the vacuum paddle is placed on second surface 62, while the vacuum on first surface 10 is released. Following transfer to the vacuum paddle, second surface 62 is held by vacuum, while first surface 10 is exposed. Referring to FIG. 6d, lamina 40 is then transferred from the vacuum paddle to a temporary carrier 50. It is affixed to temporary carrier 50, for example using an adhesive. This adhesive must tolerate moderate temperature (up to about 200 degrees C.) and must be readily releasable. Suitable adhesives include, for example, polyester with maleic anhydride and rosin, which is hydrocarbon-soluble; or polyisobutylene and rosin, which is detergent soluble. Temporary carrier 50 may be any suitable material, for example glass, metal, polymer, silicon, etc. Following transfer, first surface 10 will be held to temporary carrier 50 by adhesive, while second surface 62 is exposed.

An etch step to remove damage caused by exfoliation may be performed, for example by mix of hydrofluoric (HF) acid and nitric acid, or using KOH. It may be found that annealing is sufficient to remove all or nearly all damage and this etch is unnecessary. At minimum, the surface would be cleaned of organic materials and residual oxide, using a dilute HF solution; for example, 10:1 HF for two minutes. Following this wet process, an amorphous silicon layer is deposited on second surface 62. This layer 72 is heavily doped silicon and may have a thickness, for example, between about 50 and about 350 angstroms. FIG. 6d shows an embodiment that includes intrinsic or nearly intrinsic amorphous silicon layer 74 between first surface 10 and doped layer 72, and in immediate contact with both. In other embodiments, layer 74 may be omitted. In this example, heavily doped silicon layer 72 is heavily doped n-type, the same conductivity type as lightly doped n-type lamina 40. Lightly doped n-type lamina 40 comprises the base region of the photovoltaic cell to be formed, and heavily doped amorphous silicon layer 72 provides electrical contact to the base region. If included, layer 74 is sufficiently thin that it does not impede electrical connection between lamina 40 and heavily doped silicon layer 72.

A TCO layer 110 is formed on and in immediate contact with amorphous silicon layer 74. Appropriate materials for TCO 110 include indium tin oxide and aluminum-doped zinc oxide. This layer may be, for example, about between about 500 to about 1500 angstroms thick, for example about 750 angstroms thick. This thickness will enhance reflection from a reflective layer to be deposited. In some embodiments this layer may be substantially thinner, for example about 100 to about 200 angstroms.

As will be seen, in the completed device, incident light will enter lamina 40 at first surface 10. After passing through lamina 40, light that has not been absorbed will exit lamina 40 at second surface 62, then pass through TCO layer 110. A reflective layer 12 formed on TCO layer 110 will reflect this light back into the cell for a second opportunity to be absorbed, improving efficiency. A conductive, reflective metal may be used for reflective layer 12. Various layers or stacks may be used. In one embodiment, reflective layer 12 is formed by depositing a very thin layer of chromium, for example about 30 or 50 angstroms to about 100 angstroms, on TCO layer 110, followed by about 1000 to about 3000 angstroms of silver. In an alternative embodiment, not pictured, reflective layer 12 may be aluminium, having a thickness of about 1000 to about 3000 angstroms. In the next step, a layer will be formed by plating. Conventional plating cannot be performed onto an aluminum layer, so if aluminum is used for reflective layer 12, an additional layer or layers must be added to provide a seed layer for plating. In one embodiment, for example, a layer of titanium, for example between about 200 and about 300 angstroms thick, followed by a seed layer, for example of cobalt, which may have any suitable thickness, for example about 500 angstroms.

Metal support element 60 is formed by plating on reflective layer 12 (a chromium/silver stack in this embodiment). To form metal support element 60 by electroplating, temporary carrier 50 and lamina 40, and associated layers, are immersed in an electrolyte bath. An electrode is attached to reflective layer 12, and a current passed through the electrolyte. Ions from the electrolyte bath build up on reflective layer 12, forming metal support element 60. Metal support element 60 may be, for example, an alloy of nickel and iron. Iron is cheaper, while the coefficient of thermal expansion of nickel is better matched to that of silicon, reducing stress during later steps. The thickness of metal support element 60 may be as desired. Metal support element 60 should be thick enough to provide structural support for the photovoltaic cell to be formed. A thicker support element 60 is less prone to bowing. In contrast, minimizing thickness reduces cost. One skilled in the art will select a suitable thickness and iron:nickel ratio to balance these concerns. Thickness may be, for example, between about 25 and about 100 microns, for example about 50 microns. In some embodiments, the iron-nickel alloy is between about 55 and about 65 percent iron, for example 60 percent iron.

Figure 6E:
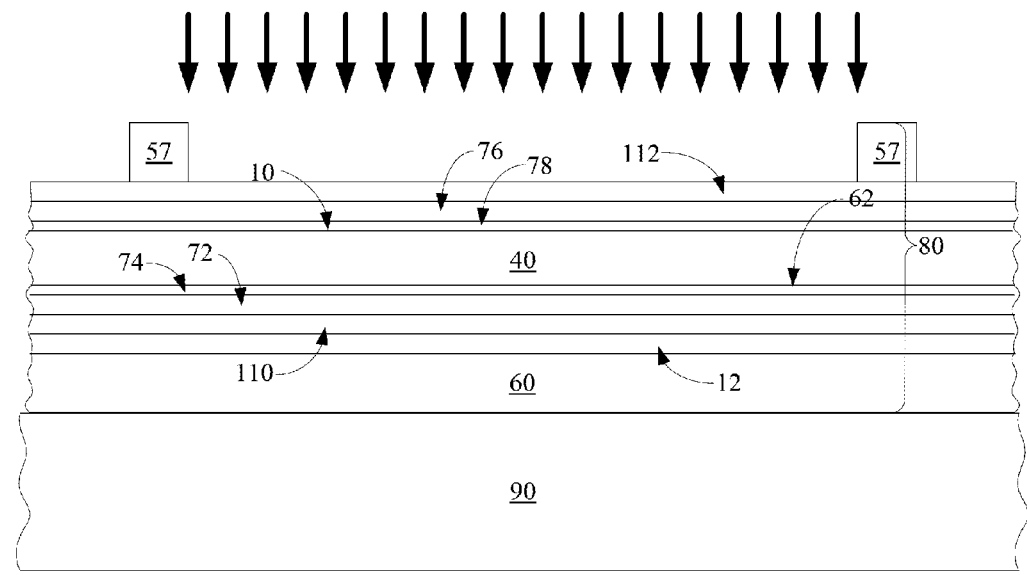

Turning to FIG. 6e, following construction of metal support element 60, temporary carrier 50 can be removed, exposing first surface 10. FIG. 6e shows the structure inverted, with metal support element 60 on the bottom, as it will be during operation. Lamina 40 is detached from temporary support element 50. In some embodiments, heating, for example to about 225 C, will cause the adhesive to soften, aiding removal. First surface 10 is cleaned, for example using a detergent, followed by a rinse. In some case a solvent may be used, such as photoresist stripper. Temporary support element 50 is also cleaned, using the same methods, and subsequently re-used.

Following cleaning, an amorphous silicon layer is deposited on first surface 10. This layer 76 is heavily doped silicon and may have a thickness, for example, between about 50 and about 350 angstroms. FIG. 6e shows an embodiment that includes intrinsic or nearly intrinsic amorphous silicon layer 78 between first surface 62 and doped layer 76, and in immediate contact with both. In other embodiments, layer 78 may be omitted. In this example, heavily doped silicon layer 76 is heavily doped p-type, opposite the conductivity type of lightly doped n-type lamina 40, and serves as the emitter of the photovoltaic cell. If included, layer 78 is sufficiently thin that it does not impede electrical connection between lamina 40 and heavily doped silicon layer 76.

A transparent conductive oxide (TCO) layer 112 is formed on and in immediate contact with amorphous silicon layer 76. Appropriate materials for TCO 112 include indium tin oxide and aluminum-doped zinc oxide. This layer may be, for example, about between about 700 to about 1800 angstroms thick, for example about 900 angstroms thick. In some embodiments, a layer having a refractive index between that of amorphous silicon layer 76 and TCO layer 112, may be formed on amorphous silicon layer 76, as described in Liang et al., U.S. patent application Ser. No. 12/894,254, "A Semiconductor with a Metal Oxide Layer Having Intermediate Refractive Index," filed Sep. 30, 2010, owned by the assignee of the present application and hereby incorporated by reference.

Metal lines 57, for example of silver paste, may be formed on TCO layer 112, for example by screen printing, and cured at a relatively low temperature, for example about 180-250 degrees C.

A method has been described to fabricate a device, the method comprising providing a monocrystalline semiconductor lamina having a thickness less than about 50 microns; affixing the semiconductor lamina to a temporary carrier; forming a metal support element on or over the lamina by plating; detaching the lamina and metal support element from the temporary carrier; and fabricating a photovoltaic cell, wherein the lamina comprises a base region of the photovoltaic cell.

A photovoltaic cell has been formed, including lightly doped n-type lamina 40, which comprises the base of the cell, and heavily doped p-type amorphous silicon layer 76, which serves as the emitter of the cell. Heavily doped n-type amorphous silicon layer 72 will provide good electrical contact to the base region of the cell. Electrical contact must be made to both faces of the cell. Contact to amorphous silicon layer 76 is made by gridlines 57, by way of TCO layer 112. Metal support element 60 is conductive and is in electrical contact with base contact 72 by way of conductive layer 12 and TCO layer 110.

FIG. 6e shows completed photovoltaic assembly 80, which includes a photovoltaic cell and metal support element 60. In alternative embodiments, by changing the dopants used, heavily doped amorphous silicon layer 72 may serve as the emitter, while heavily doped silicon layer 76 serves as a contact to the base region. Incident light (indicated by arrows) falls on TCO 112, enters the cell at heavily doped p-type amorphous silicon layer 76, enters lamina 40 at first surface 10, and travels through lamina 40. Reflective layer 12 will serve to reflect some light back into the cell. In this embodiment, receiver element 60 serves as a substrate. Receiver element 60 and lamina 40, and associated layers, form a photovoltaic assembly 80. Multiple photovoltaic assemblies 80 can be formed and affixed to a supporting substrate 90 or, alternatively, a supporting superstrate (not shown). Each photovoltaic assembly 80 includes a photovoltaic cell. The photovoltaic cells of a module are generally electrically connected in series.

In the embodiments just described, texturing was performed before plating. In other embodiments, texturing may be performed following plating. The texturing method of Li et al. calls for a buffing step thought to introduce surface stress, which creates nucleation points for etching. When texturing is performed following plating, it may be found that the stress induced by plating may render the buffing step unnecessary, and a timed etching step with a selective etchant such as TMAH or KOH may be sufficient to form pyramids having a peak-to-valley height less than one micron.

EXAMPLE

Ceramic Support Element

The constructed support element may be formed of a variety of materials by a variety of processes. In an alternative embodiment, the support element is ceramic. Fabrication of a ceramic support element is described in more detail in Agarwal et al., U.S. patent application Ser. No. 12/826,762, "A Formed Ceramic Receiver Element Adhered to a Semiconductor Lamina," filed Jun. 30, 2010, owned by the assignee of the present invention and hereby incorporated by reference.

Figure 7A:
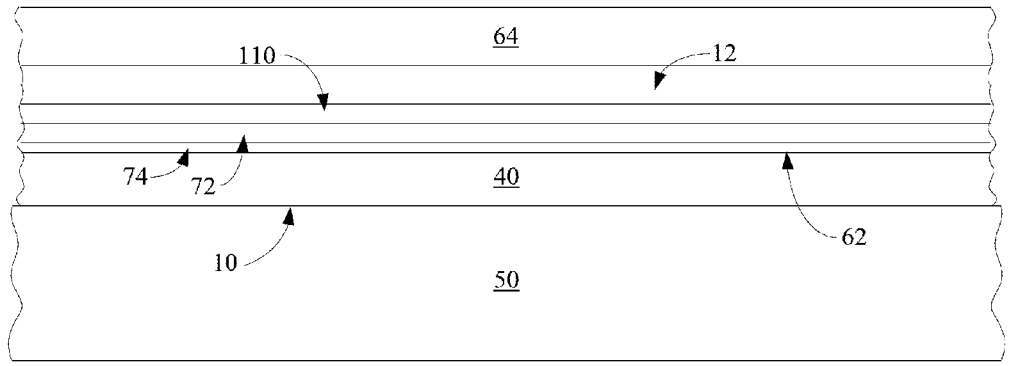
FIGS. 7a and 7b are cross-sectional views showing stage in formation of a photovoltaic device having a constructed ceramic support element according to another embodiment of the present invention.

Turning to FIG. 7a, the process may be the same as that described in the prior embodiment through formation of reflective metal layer or stack 12. Metal layer or stack 12 may be, for example, a very thin layer of chromium formed on TCO 110, for example about 20 to about 100 angstroms, followed by a layer of silver, for example about 1000 to about 3000 angstroms. Alternatively, a thin layer of titanium, for example about 100 angstroms or less, may be deposited on TCO layer 110, followed by about 1000 to about 3000 angstroms of silver. Other materials may be used. An optional thin layer of titanium, for example 100-300 angstroms, may be formed as the last layer of stack 12. This layer will serve as an adhesion layer, providing good adhesion for the layer to come.

Next a ceramic mixture 64, including a ceramic powder and a binder, for example a liquid binder, is applied on metal layer or stack 12. The ceramic powder can be any suitable material, for example aluminum silicate, also known as mullite, or zirconium silicate. Any of these forms, or any other suitable ceramic, may be used. A conductive component, such as graphite powder or metal filings, may be included to cause the resulting ceramic body to be conductive. A sodium silicate solution, for example a 40 percent dilution of pure sodium silicate in water, may serve as a binder. In one example, a mixture was formed by mixing 75 g of aluminum silicate and 55 g of graphite powder (55 g) with 135 g of liquid sodium silicate in a 40 percent dilution. As will be understood by those skilled in the art, these ratios may be varied to achieve the desired conductivity, cure conditions, etc. Other binders, ceramic powders, or conductive components may be substituted.

Ceramic mixture 64 should be applied with sufficient thickness to achieve uniform distribution and to make a receiver element of adequate strength, but not so thick that it will tend to hinder outgassing. A finished thickness of about 1 to about 3 mm thick, for example about 1.6 to about 2 mm thick, may be preferred.

Ceramic mixture 64 may be applied by any suitable method, for example by squeegee, spray, or jet writer. Curing should be performed slowly enough to allow outgassing. If the mixture skins over early in the curing process, volatiles will be unable to outgas. In one example, curing is performed for twenty-four hours at room temperature, though cure time can be reduced by increasing cure temperature. After cure, ceramic body 64 in the present example is between about 1.6 and about 2.0 mm thick, and is rigid enough and strong enough to be handled by standard wafer-handling equipment without damage.

Following cure, temperature is ramped, either continuously or in increments, for example in an oven. In one example, temperature is ramped successively to 75 degrees C., to 110 degrees C., to 250 degrees C., with a dwell time of about two hours at each temperature, though one skilled in the art will appreciate that this sequence may be varied or optimized. Embodiments in Agarwal et al. describe a peak cure temperature of 520 degrees C. This cure temperature will cause amorphous silicon layer 74 to crystallize, and is similarly incompatible with use of aluminum or silver in reflective metal layer 12, as both readily diffuse in silicon at 520 degrees C. The ceramic mixture can be cured at a lower temperature by increasing cure time. The ceramic body 64 may be accumulated by application and curing of multiple layers.

Figure 7B:
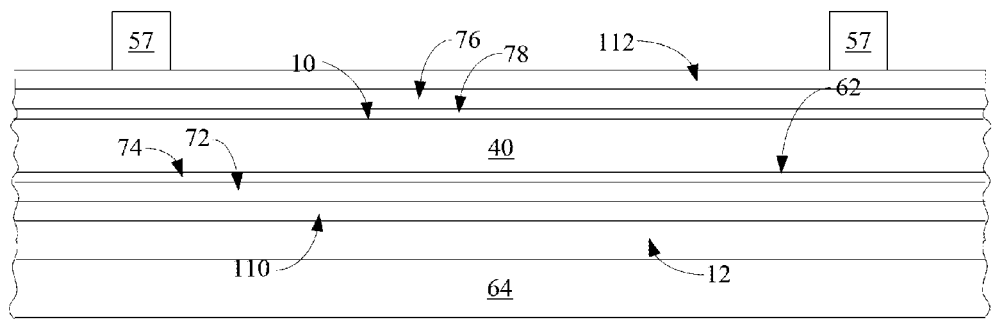

Turning to FIG. 7b, fabrication continues as in the prior embodiment: The lamina 40 and constructed ceramic support element 64 are removed from temporary carrier 50, and amorphous silicon layer 78 and 76, TCO layer 112, and grid lines 57 complete the device. The structure is shown inverted, with constructed ceramic support element 64 on the bottom, as during operation. In the completed device, incident light enters lamina 40 at first surface 10. The assembly thus created can be mounted on a supporting substrate or superstrate with other similar assemblies, as in the prior embodiment.

Figure 8:
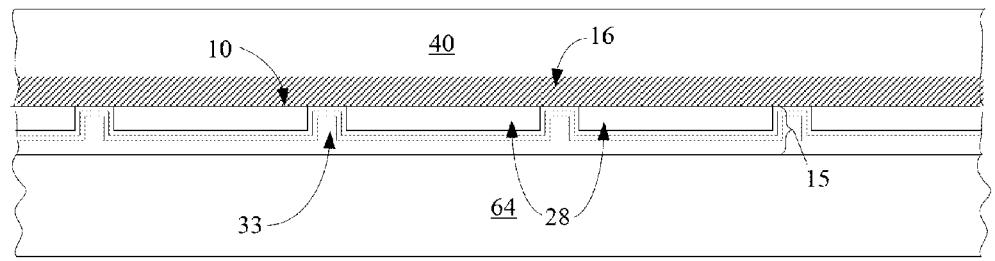
FIG. 8 is a cross-sectional view showing a photovoltaic device having a constructed ceramic support element according to an alternate embodiment of the present invention.

Alternatively, a structure able to tolerate higher temperature may be formed. Turning to FIG. 8, following creation of second surface 62 by cleaving of lamina 40, and following the damage anneal, second surface may be doped, for example by diffusion doping, to form a heavily doped n-type region 16 at second surface 62. A dielectric layer 28 may be formed on second surface 62, for example of silicon dioxide. Vias 33 are formed in dielectric layer 28, and a metal stack 15 is deposited on dielectric layer 28, contacting second surface 62 in vias 33. Metal stack 15 may include metal layers such as titanium, tungsten, cobalt, etc., which can tolerate temperatures above 400 degrees C. Such a stack is described in more detail of Agarwal et al. A ceramic body 64 constructed on such a surface can be cured at higher temperature, for example at about 520 degrees C.

An optional additional metal layer or stack (not shown) may be included on the back of ceramic body 64, on the surface opposite the lamina, to assist in soldering contacts. This stack may be, for example, a layer of aluminum or silver followed by NiV or another suitable material.

EXAMPLE

Polymer Support Element

Figure 9A:
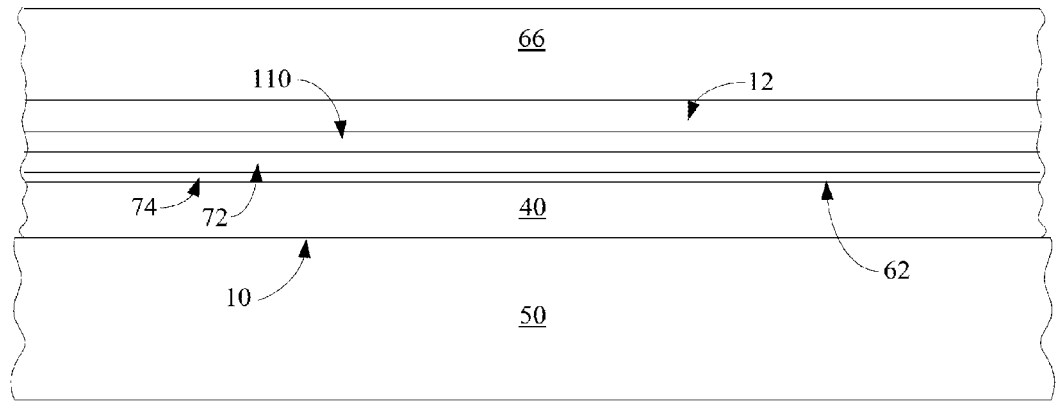
FIGS. 9a-9b are cross-sectional views showing stages in formation of a photovoltaic device having a constructed polymer support element according to another embodiment of the present invention.

In another alternative embodiment, the support element is formed of a polymer. Turning to FIG. 9a, the process may be the same as that described in the prior embodiment (having a constructed ceramic body) through formation of metal layer or stack 12.

To begin to form a polymer support element, polymer in liquid form is applied to low-resistance layer 22. Polymer layer 66 can be applied by any of a variety of known methods. It may be spun on; in this case the thickness of layer 66 will vary with the volume applied and the spin speed. This layer may be sprayed on or applied by any other suitable method. A drying step is performed at, for example, about 120 to about 200 degrees C. for several minutes or hours. After drying, a cure step is performed at any suitable temperature. In some embodiments, the drying and curing steps may be combined. After curing, polymer layer 66 may be, for example, between about 5 and about 30 microns thick. Multiple polymer layers may be formed to create a thicker polymer body, for example up to 100 microns thick or more; this may aid in keeping curing time and temperature low. After constructing and curing of polymer support element 66, it and lamina 40 are removed from temporary carrier 50 and fabrication is completed as in prior embodiments.

Figure 9B:
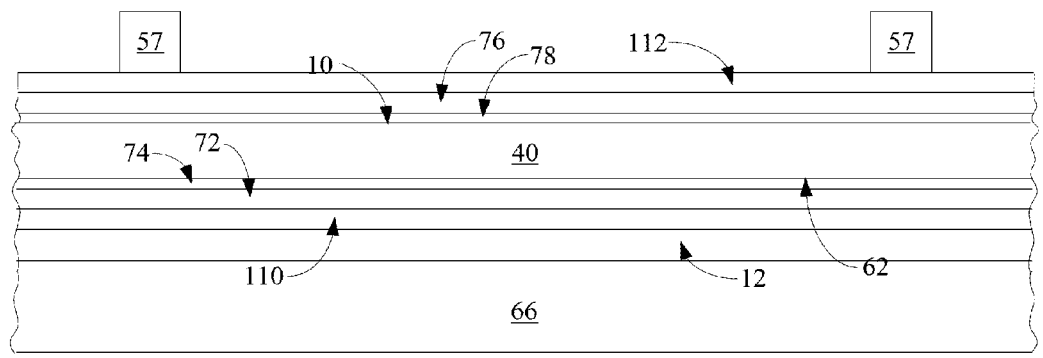

Fabrication continues as in prior embodiments. Turning to FIG. 9b, the temporary support element is removed. The structure is shown inverted, with polymer support element 66 on the bottom. Amorphous silicon layers 78 and 76 are formed, as is TCO layer 112 and wiring 57. In the completed device, incident light enters lamina 40 at first surface 10.

In an alternative embodiment (not shown), curing may be performed at a higher temperature by a) replacing amorphous silicon layers 72 and 74 by forming a heavily doped region at second surface 62 of lamina 40 and b) replacing aluminum or silver with metals able to tolerate higher temperature, as described in the previous section, in which a ceramic support element is constructed.

Various constructed support elements have been described. If the constructed support element is not conductive, electrical contact to the heavily doped region at region of the cell adjacent to the support element (either a heavily doped amorphous silicon layer or a region formed by doping in various embodiments) can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference.

More or Fewer Lamina Transfers

In the embodiments described so far, the original surface of the donor wafer is affixed to a vacuum chuck; then, following cleaving of the lamina, the cleaved surface is held by a vacuum paddle and the original surface released; following transfer to a temporary carrier the original surface is affixed and the cleaved surface is released; and following additional processing the original surface is released from the temporary carrier. In this flow there are three releases of a surface: the original surface from the vacuum chuck, the cleaved surface from the vacuum paddle, and the original surface from the temporary carrier. Other options are possible, however.

Figure 10A:
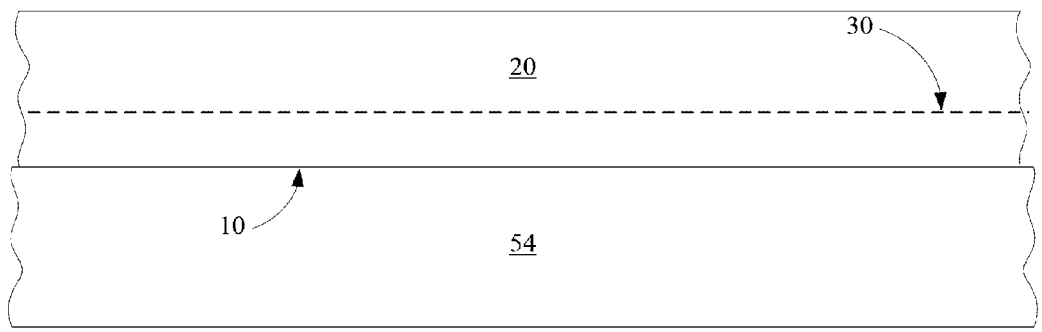
FIGS. 10a-10d are cross-sectional view showing stages in formation of a photovoltaic device having a constructed support element with fewer releases of a thin lamina.
Figure 10B:
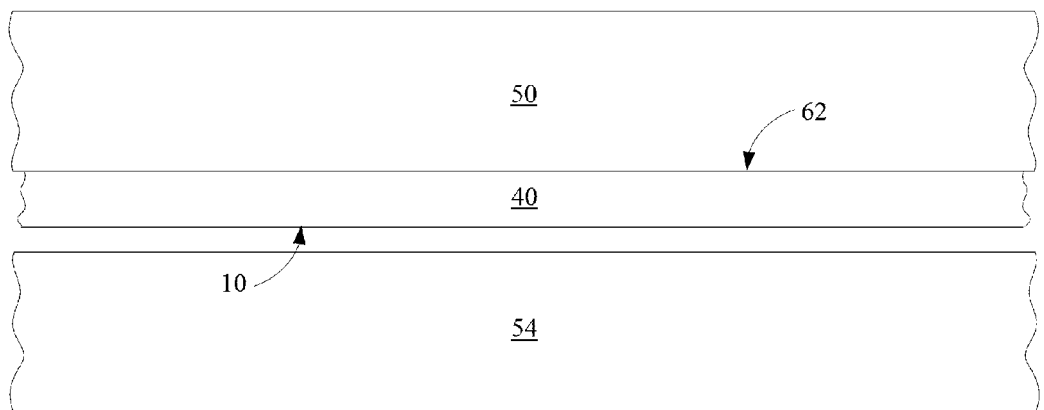
Figure 10C:
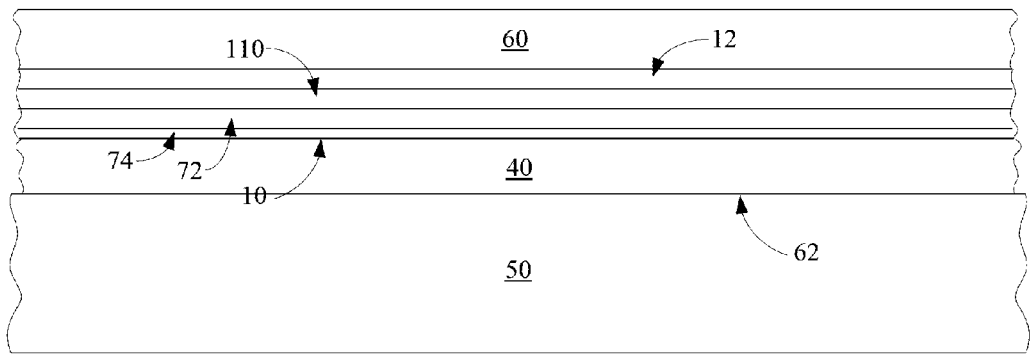
Figure 10D:
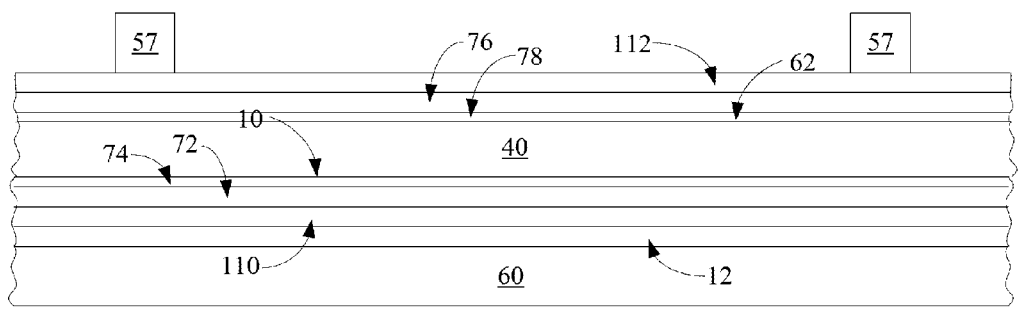

Process flow can be simplified. Turning to FIG. 10a, in one embodiment, first surface 10 of donor wafer 20 (including cleave plane 30, previously defined by ion implantation) is held to vacuum chuck 54. Turning to FIG. 10b, following cleaving of lamina 40 (which creates second surface 62), temporary carrier 50 is affixed to second surface 62, for example using adhesive, and first surface 10 is released from vacuum chuck 54. Turning to FIG. 10c, which shows the structure inverted with temporary support element 50 on the bottom, amorphous layers 74 and 72, TCO layer 110, and reflective metal layer 12 are deposited on first surface 10, followed by construction of support element 60 on metal layer 12. As shown in FIG. 10d, second surface 62 is detached from the temporary carrier (the structure is again inverted, this time with constructed support element 60 on the bottom, as during operation of the completed device), and, following clean, amorphous layers 78 and 76 and TCO layer 112 are formed on second surface 62. Wiring 57 is formed by screen printing and cured. This process flow involves only two releases: first surface 10 from the vacuum chuck and second surface 62 from the temporary carrier. In the completed device, incident light enters lamina 40 at second surface 62, and first surface 10 is at the back of the cell.

Figure 11A:
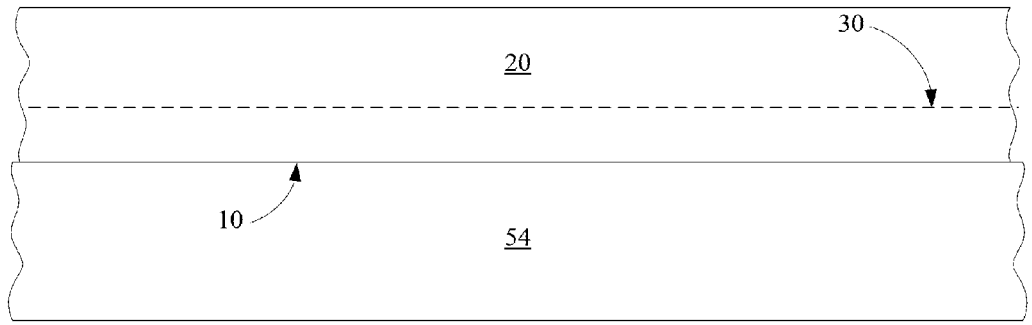
FIGS. 11a-11d are cross-sectional view showing stages in formation of a photovoltaic device having a constructed support element with more releases of a thin lamina.
Figure 11B:
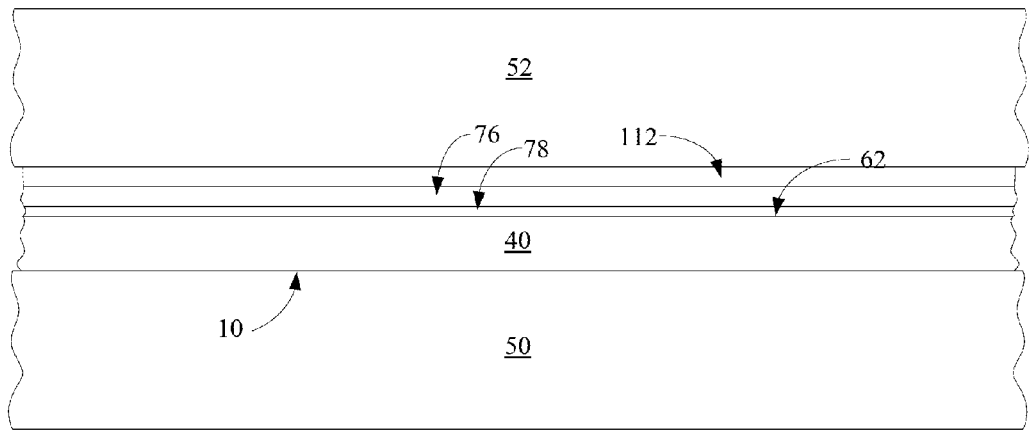
Figure 11C:
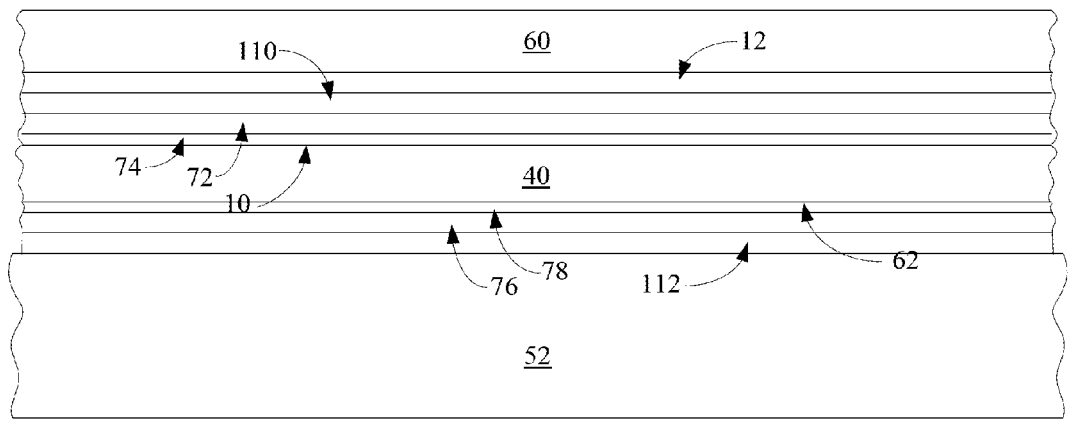
Figure 11D:
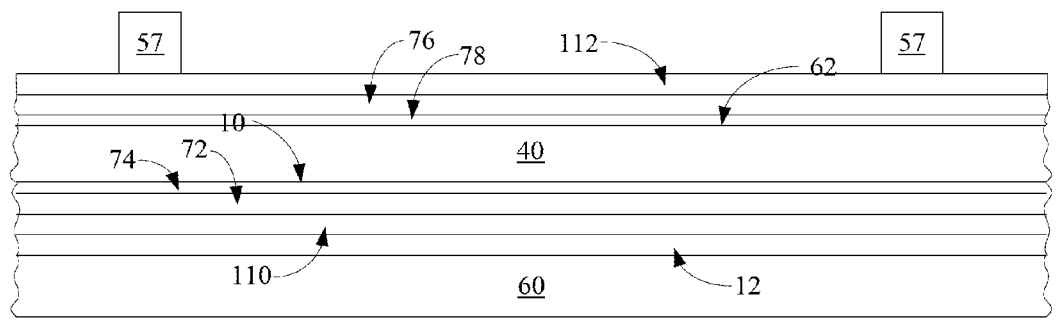

In other embodiments, there may be one or more additional releases. Turning to FIG. 11a, first surface 10 is held to vacuum chuck 54. Turning to FIG. 11b, following cleaving of lamina 40, a vacuum paddle (not shown) is used to transfer lamina 40 to first temporary carrier 50. First surface 10 is affixed, while second surface 62 is exposed. Amorphous layers 78 and 76 and TCO layer 112 are deposited on second surface 62. Second temporary carrier 52 is affixed to TCO layer 112 (over second surface 62). Following attachment of second temporary carrier 52, first surface 10 is detached from temporary carrier 50. Turning to FIG. 11c, which shows the structure inverted with second temporary carrier 52 on the bottom, first surface 10 is cleaned and amorphous silicon layers 74 and 72 and TCO layer 110 are formed on first surface 10, followed by reflective metal layer 12. Metal support element 60 is formed on metal layer 12 by plating. Turning, finally, to FIG. 11d, TCO layer 112 is detached from the second temporary carrier, and wiring 57 is formed on TCO layer 112 by screen printing and cured. This process flow involves four releases: first surface 10 from the vacuum chuck, second surface 62 from the vacuum paddle, first surface 10 from first temporary carrier 50, and second surface 62 from second temporary carrier 52. In the completed device, incident light enters lamina 40 at second surface 62, and first surface 10 is at the back of the cell. This flow is more complex, but provides the advantage that the NiFe constructed support element 60 is formed very near the end of the process, after all deposition steps are complete. This provides for a cleaner process, and may avoid contamination of equipment.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to fabricate a device, the method comprising:
providing a monocrystalline semiconductor lamina having a thickness about 50 microns or less, the lamina having a first surface and a second surface opposite the first;
annealing the semiconductor lamina to a temperature of 850 degrees C. or greater; and
fabricating a photovoltaic cell, wherein the completed cell has a first amorphous silicon layer in immediate contact with the first surface, and a second amorphous silicon layer in immediate contact with the second surface.

2. The method of claim 1 wherein the lamina has a thickness between about 4 microns and about 20 microns.

3. The method of claim 1 wherein the first amorphous silicon layer and the second amorphous silicon layer are both deposited after the annealing step.

4. The method of claim 1 wherein the first amorphous silicon layer comprises an emitter of the photovoltaic cell, or the second amorphous silicon layer comprises an emitter of the photovoltaic cell.

5. The method of claim 1 wherein at least a portion of the first amorphous silicon layer is heavily doped to a first conductivity type, and at least a portion of the second amorphous silicon layer is heavily doped to a second conductivity type opposite the first.

6. The method of claim 1 wherein the lamina comprises a base region of the photovoltaic cell.

7. The method of claim 1 wherein the step of providing a semiconductor lamina comprises:
implanting ions into a semiconductor donor body to define a cleave plane; and
cleaving the lamina from the donor body at the cleave plane.

8. The method of claim 1 wherein, during the annealing step, temperature reaches at least 900 degrees C.

9. The method of claim 1 wherein the annealing step lasts at least 60 seconds.

10. The method of claim 1 further comprising, following the annealing step, constructing a permanent support element on or over the first surface of the lamina, wherein, in the completed cell, the first amorphous silicon layer is disposed between the first surface of the lamina and the support element.

11. The method of claim 10 wherein the step of constructing a permanent support element comprises plating, and the permanent support element comprises metal.

12. The method of claim 10 wherein the step of constructing a permanent support element comprises:
applying a ceramic mixture to the first surface of the lamina; and
curing the ceramic mixture, wherein the permanent support element is ceramic.

13. The method of claim 10 wherein a reflective metal layer is disposed between the permanent support element and the first amorphous silicon layer.

14. The method of claim 13 wherein a transparent conductive oxide layer is disposed between the reflective metal layer and the first amorphous silicon layer.

* * * * *